(12) United States Patent  (10) Patent No.: US 8,567,658 B2
Schulte  (45) Date of Patent: Oct. 29, 2013

(54) METHOD OF PLASMA PREPARATION OF METALLIC CONTACTS TO ENHANCE MECHANICAL AND ELECTRICAL INTEGRITY OF SUBSEQUENT INTERCONNECT BONDS

(75) Inventor: Eric Frank Schulte, Santa Barbara, CA (US)

(73) Assignee: Ontos Equipment Systems, Inc., Chester, NH (US)

( * ) Notice: Subject to any disclaimer, the term of this patent is extended or adjusted under 35 U.S.C. 154(b) by 241 days.

(21) Appl. No.: 12/837,751

(22) Filed: Jul. 16, 2010

(65) Prior Publication Data

US 2011/0011531 A1 Jan. 20, 2011

Related U.S. Application Data

(60) Provisional application No. 61/227,063, filed on Jul. 20, 2009.

(51) Int. Cl.
*B23K 35/38* (2006.01)
*B23K 31/02* (2006.01)
*H01L 21/44* (2006.01)

(52) U.S. Cl.
USPC ... 228/180.22; 228/116; 228/206; 228/180.1; 438/612; 438/613

(58) Field of Classification Search
USPC .......... 228/116, 206, 180.1, 180.22; 156/281; 134/1.1, 1.2; 438/612, 613
See application file for complete search history.

(56) References Cited

U.S. PATENT DOCUMENTS

| 4,865,245 | A  * | 9/1989  | Schulte et al. ............... 228/116 |
| 5,722,581 | A  * | 3/1998  | Sindzingre et al. ........... 228/206 |
| 5,928,527 | A  * | 7/1999  | Li et al. ............................ 216/67 |
| 6,277,725 | B1 * | 8/2001  | Hsiao ............................ 438/612 |
| 6,471,115 | B1 * | 10/2002 | Ijuin et al. ............... 228/180.22 |
| 6,586,323 | B1 * | 7/2003  | Fan et al. ....................... 438/614 |
| 6,712,260 | B1 * | 3/2004  | Kuo et al. ............... 228/180.22 |
| 7,079,370 | B2 * | 7/2006  | Dong et al. ................... 361/230 |
| 7,307,826 | B2 * | 12/2007 | Dong et al. ................... 361/230 |
| 7,602,070 | B2 * | 10/2009 | Tong et al. .................... 257/777 |
| 2004/0168705 | A1 * | 9/2004 | Sun et al. ....................... 134/1.2 |
| 2010/0279489 | A1 * | 11/2010 | Wang ............................ 438/460 |

OTHER PUBLICATIONS

Uner et al., "The Application of Atmospheric Pressure Plasma to various steps in Integrated Circuit Packaging", 3rd Annual Semiconductor Packaging Symposium, SEMICON West 2000, p. 1-6.*
Potier et al., "Fluxless Soldering under Activated Atmosphere at Ambient Pressure", Jun. 2001, US Patent 7079370.*

* cited by examiner

*Primary Examiner* — Devang R Patel
(74) *Attorney, Agent, or Firm* — Robert O. Groover, III; Gwendolyn S.S. Groover; Groover & Associates PLLC

(57) ABSTRACT

A method of removing oxidation from certain metallic contact surfaces utilizing a combination of relatively simple and inexpensive off-the-shelf equipment and specific chemistry. The method being a very rapid dry process which does not require a vacuum or containment chamber, or toxic gasses/chemicals, and does not damage sensitive electronic circuits or components. Additionally, the process creates a passivation layer on the surface of the metallic contact which inhibits further oxidation while allowing rapid and complete bonding, even many hours after surface treatment, without having to remove the passivation layer. The process utilizes a room-ambient plasma applicator with hydrogen, nitrogen, and inert gasses.

17 Claims, 2 Drawing Sheets

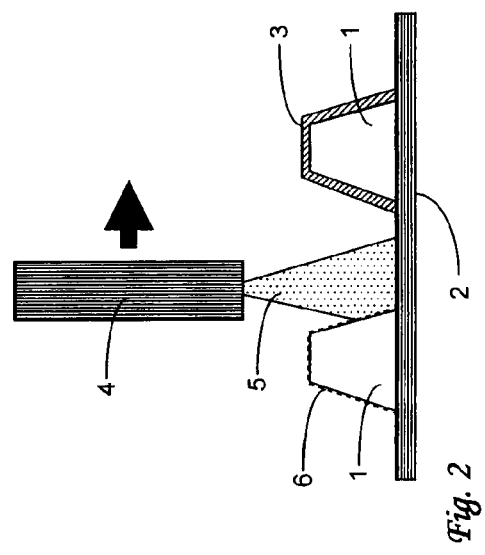
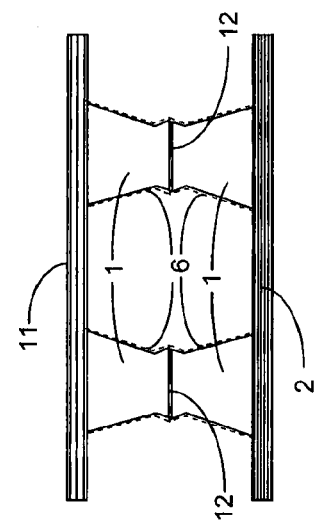
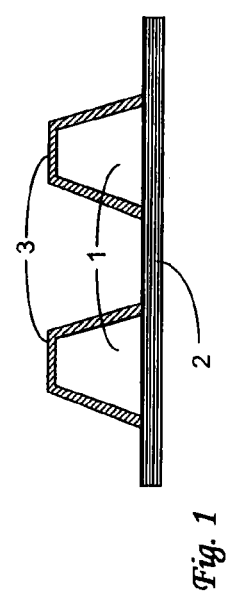
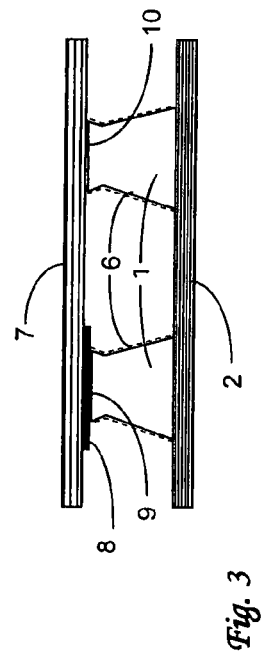

METHOD OF PLASMA PREPARATION OF METALLIC CONTACTS TO ENHANCE MECHANICAL AND ELECTRICAL INTEGRITY OF SUBSEQUENT INTERCONNECT BONDS

This application claims priority from U.S. Provisional Application No. 61/227,063 which was filed on Jul. 20, 2009.

FIELD OF THE INVENTION

This invention relates to the interconnect bonding of electrical, optical and/or mechanical components to form a three-dimensional multi-chip hybrid assembly. More specifically, it relates to the surface preparation of metallic contacts on the surface of flip-chip components to improve process throughput, yield, and reliability of the subsequent electrical and/or mechanical connection.

BACKGROUND OF THE INVENTION

Metallic contact flip-chip interconnect bonding has been successfully used for many years to provide mechanical and/or electrical connection between two or more electrical, optical, and-or mechanical components. An example of the flip-chip interconnect would be the face-to-face indium bump bonding of an optical detector chip to its corresponding read-out integrated circuit (ROIC) chip to form an infrared detector focal plane assembly. Many other types of 3-dimensional hybrid assemblies utilize similar metallic connection schemes. It is understood in the industry that removal of native oxidation from the surface of the metallic contacts prior to bonding results in a much improved electrical and/or mechanical interconnection by removing the relatively thick and tough indium oxide layer from the contacts, thus allowing metal-to-metal bonding without the impediment of the tough oxide layer at the interface. This elimination of interfacial oxide also improves ohmic contact between the two surfaces by eliminating the non-conducting or semiconducting metal-oxide interfacial layer.

Various prior art methods of oxide removal have been devised including acid chemical etching as taught by Schulte and Olson in U.S. Pat. No. 4,865,245 to improve hybridization cold-welds, and vacuum plasma etching of the metallic contacts prior to hybrid bonding. Each of these methods has specific drawbacks. Example drawbacks of acid chemical etching include the potential for liquid-borne or airborne contamination of the devices, handling damage to delicate chips, a residue of acid etchant on the surface of the components which can lead to reliability problems, cost of chemicals and their subsequent disposal, a slow process turnaround time, usage of toxic and dangerous chemicals, the need for corrosion-resistant etching hardware and enclosures, high maintenance requirements, the need for toxic/corrosive exhaust provisions, and unwanted chemical reactions between the etchant and other surface features of the chips. Example drawbacks of vacuum plasma etching for oxide removal include expensive vacuum plasma equipment, slow process turnaround time, potential for plasma damage to the components by hot electrons, ions, and high kinetic energy atoms, back-sputtering of unwanted metals from vacuum chamber components or from the substrate itself onto the substrate being cleaned, expensive and time-consuming maintenance requirements of the required equipment, and a higher level of operator proficiency and training needed to run sophisticated vacuum plasma systems.

Additionally, and very significantly, these methods only very temporarily remove oxidation from the metallic contacts, since the oxide regrows rapidly when exposed to air after the oxide reduction process. If the bonding cannot be performed in a very short period of time, and/or if the bonding is performed at elevated temperature, the regrown oxide inhibits bonding of the metallic contacts. The thicker the layer of regrown oxidation, the more compression and deformation of the contacts are required to obtain even marginal metal-to-metal cold welding.

Prior art also teaches deposition of an oxidation-inhibiting layer on the deoxidized surface, but that layer must be removed prior to bonding. This poses two problems: 1) equipment and process time required to remove the oxidation inhibiting layer are costly and time-consuming; and 2) once the oxidation inhibiting layer is removed, the surface is once again subject to re-oxidation prior to the bonding. To offset these drawbacks, the removal of the passivating layer would normally involve the use of a vacuum chamber or confinement chamber to facilitate the chemical reaction and also to slow the re-oxidation process. These chambers impose additional time, expense, bulk, and complexity to the bonding process and equipment.

What is needed is a rapid, non-damaging, inexpensive, simple process for metallic oxide removal which also produces a modified surface that inhibits the regrowth of oxide while at the same time not hindering bonding ability, so that it need not be removed prior to bonding; thus forming electrically and/or mechanically robust interconnect bonds.

SUMMARY OF THE INVENTION

This invention consists of a process method which utilizes a combination of relatively simple and inexpensive "off-the-shelf" equipment and specific chemistry to remove oxidation from certain metallic contact surfaces with a very rapid dry process which does not require a vacuum or containment chamber, or toxic gasses/chemicals, and does not damage sensitive electronic circuits or components. Additionally, the process creates a passivation layer on the surface of the metallic contact which inhibits further oxidation while allowing rapid and complete bonding—even many hours after surface treatment, without having to remove the passivation layer. The process utilizes a room-ambient plasma applicator with an activated chemical reducing agent such as hydrogen gas, an activated chemical passivation agent such as nitrogen gas, and inert gasses. Specific ranges of process parameters such as power, gas flow rates, flow ratios, proximity, temperature, and dwell time which accomplish the above-stated goals are specified herein.

As referenced within this specification, the term "activated chemical reducing agent" includes, but is not limited to, one or more of the following: hydrogen gas, hydrogen forming gas (hydrogen/argon or hydrogen/nitrogen mixture), ammonia, hydrogen sulfide, methane (and similar hydrogen-containing organic compounds), and carbon monoxide.

As referenced within this specification, the term "activated chemical passivation agent" includes, but is not limited to, one or more of the following: nitrogen, nitrogen forming gas, such as hydrogen/nitrogen mixture, ammonia or other nitrogen-containing mixture.

BRIEF DESCRIPTION OF THE DRAWINGS

An example of the present invention will be described below with reference to the accompanying drawings, in which:

FIG. 1 shows a cross sectional view of an array of metallic contacts situated on a substrate;

FIG. 2 shows a cross sectional view of an atmospheric-ambient plasma head subjecting the metallic contacts to an activated gaseous agent;

FIG. 3 shows a cross sectional view of the array of treated metallic contacts bonded to a second substrate;

FIG. 4 shows a cross sectional view of an alternate bonding capability of the surface preparation technique with two metallic-contact arrays;

DETAILED DESCRIPTION OF THE INVENTION

Figure 5:
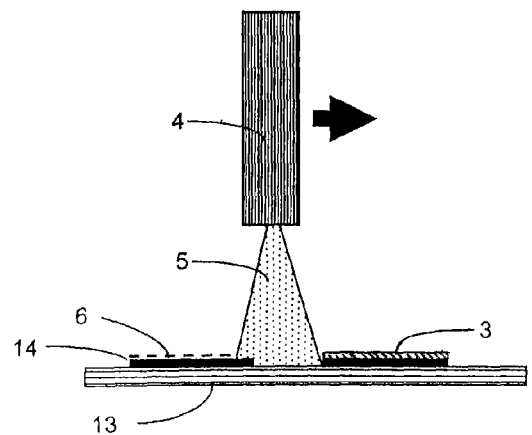
FIG. 5 shows a cross sectional view of an atmospheric-ambient plasma head subjecting metallic contacts of a first array to an activated gaseous agent.

The present invention relates to a method for preparing and bonding surfaces, such as metallic contacts, by the sequential or concurrent application of a reducing agent and a passivation agent to remove an oxidation layer from the surfaces and then generate a passivated layer on the surfaces to prevent the subsequent formation of oxides on the surfaces. For purposes of the present invention and the following descriptions of the invention, an "agent", such as a reducing agent or a passivation agent, is defined as a member, or species, of one or more groups, or genuses, of elements, chemicals or chemical compounds or mixtures thereof in a gaseous form suitable for application to the surfaces to be treated and providing the desired effect on the surfaces to be treated, such as the removal of oxides from the surfaces or the passivation of the surfaces to prevent the subsequent formation of oxides thereon.

FIG. 1 shows an array of metallic contacts 1 situated on a substrate 2. The metallic contacts 1 have an oxide layer 3 such as grown by exposure to air (native oxide) or by exposure to activated oxygen such as from a plasma or ozone asher. In FIG. 2, a room-ambient plasma source 4 (atmospheric-ambient plasma head) is scanned across the surface of the array subjecting the oxidized metallic contacts 1, 3 to activated gaseous agent or agents 5 which chemically reduce and/or remove the oxidation on the surface of the metallic contacts 1 and create a chemically altered surface 6 on the metallic contacts 1 which inhibits subsequent oxidation. This process may be performed at room temperature, or at an elevated or reduced temperature, as may be desired to alter the kinetics of the chemical reaction. The nature and method of generation of these activated gaseous agents, and their application and effect on the surface of the metallic contacts 1, are a subject of this patent. FIG. 3 shows a subsequent method step of bonding of the treated metallic contacts 1 to a second substrate, which in this figure is shown to have corresponding contact pads 8 as well as a plain surface 7. The bonding process as described herein may occur at room temperature or elevated temperature, for example up to 250 degrees C. and higher, depending upon the materials chosen for the contacts 1 and the opposing contact pads 8 and plain surface 7. The interface 9 or 10 between the altered surfaces 6 of the metallic contacts 1 and the opposing contact pad 8 or the plain surface 7, respectively, is a key result of this patent in that the altered surfaces 6 of the contacts 1 are receptive to mechanical and electrical bonding with the opposing contact pad 8 and the plain surface 7, since inhibiting oxide has been removed and is not present, and the altered contact surface 6 does not inhibit or frustrate bonding. FIG. 4 demonstrates an alternative bonding capability of this surface preparation technique wherein two metallic-contact arrays are subject to the inventive method of surface preparation including ambient-atmosphere plasma treatment, as seen in FIG. 2, and are then bonded to each other. As used herein, the term bond can refer to "flip-chip" bonds, cold weld bonds, compression bonds, and soldered connections. The resulting interface 12 between the opposing contacts 1 is mechanically and electrically robust as a result of the taught method of ambient-atmosphere plasma treatment.

This invention describes the joint use of known de-oxidation chemistry, known nitride passivation chemistry, known room-ambient plasma sources, and known metallic contact materials, which when used in combination and under certain process conditions and parameters, provide exceptionally thorough and successful surface preparation of metallic contacts for subsequent bonding.

Surface oxidation of metallic ("Me" in the reactions cited below) contacts must be removed and prevented from re-growing if optimum metal-to-metal bonding is to be achieved. Chemically activated reducing agents, such as hydrogen in this example, are known to remove metallic oxidation by reducing the oxide to metal and water by the following chemical reaction:

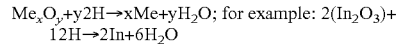

$Me_xO_y + y2H \rightarrow xMe + yH_2O$; for example: $2(In_2O_3) + 12H \rightarrow 2In + 6H_2O$ In this example, activated reducing gas of hydrogen is supplied by a room-ambient plasma source by plasma activation of a reducing agent or agents, such as hydrogen gas or other hydrogen-containing gas such as forming gas (hydrogen/argon or hydrogen/nitrogen mixture), ammonia, hydrogen sulfide, methane (and similar hydrogen-containing organic compounds). In addition to hydrogen, nitrogen from either nitrogen gas or a nitrogen containing gas such as forming gas (hydrogen/nitrogen mixture) or ammonia, is simultaneously present in the plasma for the specific purpose of passivation of the surface by converting the metal of the newly de-oxidized metal surface to a metal nitride by the following chemical reaction:

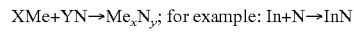

$XMe + YN \rightarrow Me_xN_y$; for example: $In + N \rightarrow InN$

The simultaneous presence of an activated chemical reducing agent such as activated hydrogen and an activated chemical passivation agent such as activated nitrogen leads to an immediate nitridation of the exposed pure metal, as it is being reduced by the chemically activated hydrogen, before it can react with oxygen from the surrounding ambient environment. A sufficient gas flow rate out of the aperture of the plasma source combined with a close proximity of the aperture to the surface of the contact serves to purge room-ambient oxygen from the reaction region and lead to the formation of nearly pure metal-nitride without significant oxygen contained in the metal-nitride film created. An inert carrier agent, such as a gas from atomic group VIIIa such as Helium, Neon, Argon, or Xenon, can be used to enhance the striking, maintenance and effectiveness of the plasma, although the inert carrier gas is not strictly required for the desired chemical reactions taking place. The inert carrier gas should, for example, be a readily ionizable gas to excite the other gasses for high chemical reactivity. An additional benefit of the inert carrier gas is to increase the total gas flow out of the plasma head aperture, thus helping to purge the local reaction space of room air which would otherwise increase oxygen content in the grown metal-nitride film. Thus, the flow of inert gas can functionally permit an increase in the gap between the aperture of the plasma source and the surface of the metallic contacts to be treated while still maintaining a local environment sufficiently purged of ambient oxygen.

Selection of contact metal is critical to the success of the process, as some metal elements and alloys do not form stable, thin nitrides. Examples of desirable elemental contact metals are: Indium, Gallium, Aluminum, Tin, Lead, Copper, Silver, Bismuth, Molybdenum, Tantalum, Tungsten, Nickel, Titanium, Antimony, Zinc, and Gold. All of these metals form conductive, stable or semi-stable metal-nitrides which will inhibit subsequent oxidation for a useable period of time. Also, the passivation layers formed from these metal-nitrides are known to be mechanically non-robust such that modest deformation of the passivation layer during the bonding process exposes significant native metal for bonding. Additionally, alloys comprising the above metals will also benefit when surface oxidation is replaced with nitridation employing the disclosed method. Examples of desirable alloys comprising two or more of these metals include but are not limited to: Lead-Tin alloy, Indium-Silver alloy, Tin-Antimony-Copper alloy, Gold-Tin alloy, Aluminum-Copper alloy, and Tin-Antimony alloy.

A further benefit of utilizing nitridation as a passivation layer is that the nitrides of all of the metals and alloys discussed above are electrically conductive. As such, even if the metal-nitride passivation layer is not completely disintegrated during bonding by compression as is possible on the surface of hard metals like titanium or nickel for example, the metal-nitride layer will conduct electrical current and therefore will be beneficial in electrical connections.

Additional benefits of this combination of equipment, agents, metals and parameters are: (1) that the de-oxidation/passivation process can be accomplished very quickly—a matter of ten seconds or less per die or array of metallic contacts, and (2) the compact size of a room-ambient plasma source allows this process to be integrated with the flip chip process equipment with little or no additional manufacturing space being required (although integration with the flip chip equipment is not necessary to enjoy the other benefits of this method).

Due to the short process time and compact size of the apparatus, it is also possible to achieve similar process benefits with a sequential process where one scan (or series of scans) of the plasma source performs the de-oxidation/reduction process and a subsequent scan (or series of scans) performs the nitridation/passivation process before excessive oxidation can occur. While this sequential process is less desirable because of a finite amount of oxidation which can form on the surface of the metallic contacts in the time period between the de-oxidation/reduction and nitridation/passivation, it still holds substantial benefit over all other methods in the prior art, and is therefore included in this disclosure.

The temperature of the contacts during the reducing and/or passivation processes can have a significant effect on the kinetics of the reactions. Higher temperature, for example, will increase the rate at which the activated reducing agent reacts with the surface oxide to convert it back to native metal. In the case of thicker native oxides, such as can exist on copper contacts for example, higher temperature can significantly decrease the process time required to reduce all of the oxide from the surface. Conversely, in the case of indium contact metal, the native oxide is self-limiting to a thickness of approximately 30-50 Angstroms, so complete removal of the oxidation can be accomplished in a few seconds even at room temperature. Contact metal temperature will also affect the growth kinetics of the passivating nitride. For example, higher temperatures will promote a thicker metal-nitride surface layer growth. This may be desirable, or undesirable, depending on the metal(s) involved and what the user wishes to accomplish with the passivation layer. Higher contact temperature could have a negative affect if employing a sequential reduction/passivation process, in that more oxidation is likely to occur in the dwell period after the reduction process but before the passivation process. This would result in more oxygen being incorporated into the passivation layer, potentially decreasing its effectiveness. In practice of the sequential process, it is certainly possible to use different temperatures for reduction and passivation, respectively. Summarizing then, contact temperature selection requires consideration of the particular metals involved and the desired ultimate surface passivation characteristics. Therefore, numerous combinations of contact temperature are possible within the purview of this invention method.

A preferred embodiment of this invention for treating contacts such as indium contact bumps, utilizes a commercially available room-ambient plasma source that is capable of being mechanically scanned above the surface of metallic contacts (indium contact bumps) of an infrared detector die and the metallic contacts (indium contact bumps) of a readout integrated circuit die (ROIC), as shown in FIG. 2. Prior to the scan, hydrogen, nitrogen and helium gasses flow through the plasma source at flow rates of 0.05, 0.1, and 10 standard liters per minute (LPM), respectively. Electrical power at 70 watts is applied to the plasma source to create a plasma (gas having activated atoms) within the plasma source. Once the plasma has become stable, the plasma source is scanned one or more times across the surface of both the infrared detector die and the ROIC die at a velocity of 1.2 cm per second with a 1.0 millimeter gap between the aperture of the plasma source and the die, with both die at room temperature. As the plasma source is scanned across the surfaces of the die, chemically activated atoms (radicals) of hydrogen and nitrogen gasses are expelled from the aperture of the plasma source and react chemically with the indium contact bumps on the surfaces of both of the die. The activated hydrogen reducing agents react with the oxide on the surface of the indium contact bumps and convert the indium oxide to metallic indium and volatile water vapor. Simultaneously, activated nitrogen atoms are available to react with the freshly converted metallic indium on the surface of the indium contact bump to convert it to a thin passivation layer of indium nitride, which covers the surface of the indium contact bumps. This indium nitride passivation layer is very thin—on the order of 2-3 monolayers—but is enough to inhibit the metallic indium of the bump from oxidizing, thus acting as a passivation layer to indium oxidation. Once treated, the infrared detector die and ROIC die remain passivated against oxidation for several hours (up to several days). During this period, according to one embodiment, the two die are placed in a flip-chip bonding apparatus, aligned, and bonded together by compression, with or without elevated temperature (refer to FIG. 4). The extremely thin indium nitride layer which has been passivating the surface of the indium contact bump is readily disintegrated by even slight deformation of indium during bonding compression, allowing native indium metal in opposing contact bumps to come into contact and "cold weld" into a mechanically and electrically robust single indium column. Alternatively, the compression bond can be performed at elevated temperatures, as high as 200 degrees C. (or above), such that less compression force is required, without significant oxidation of the indium bump surfaces.

Variations in gas flows, gas flow ratios, power levels, scan speed, temperature, and spacing between the plasma source and array/metallic contacts produced similarly successful bonding results, indicating that the disclosed process can be successfully performed using parameters other than those described above. For example, the hydrogen flow rate was varied between 0.005 and 0.5 LPM, the nitrogen flow rate was varied between 0.01 and 5 LPM, the helium flow rate was varied between 1.0 and 30 LPM, the power applied to the plasma source was varied between 20 and 200 watts, the scan rate was varied between 0.1 and 15 cm per second, and the spacing between the plasma source and array/metallic contacts was varied between 0.5 and 5 mm, and chip temperature between 25° C. and 160° C. While a flow ratio of 0.1:1.0:10 of hydrogen, nitrogen and helium, respectively, and at room temperature, gave the best bonding results, a wide range of ratios covering the range of flows cited above, provided benefit to the bonding process, as did a wide range of chip temperatures. The span of successful parameters is quite broad which makes it readily clear that the concept of the invention operates over a wide range of parameters; thus the scope of the invention includes significant deviations from the above-described embodiment. Also, the concept of this invention extends beyond the utilization of pure hydrogen gas as the activated chemical reducing agent and pure nitrogen gas as the activated chemical passivating agent. Other hydrogen-generating gaseous agents such as forming gas (hydrogen/argon or hydrogen/nitrogen mixture), ammonia, hydrogen sulfide, methane (and similar hydrogen-containing organic compounds), or non-hydrogen-containing reducing gaseous agents such as carbon monoxide, can be utilized as the reducing agent; and other nitrogen-generating gaseous agents such as forming gas (hydrogen/nitrogen mixture), or ammonia can be utilized as the passivating agent. These other gaseous agents that are capable of providing reducing and passivating activated chemistry to the metallic contact surface also fall under the scope of this invention. Additionally, pre-mixing of reducing and passivating gaseous agents in a broad range of ratios and supplying the mixed gaseous agents in these fixed ratios from a single gas source has resulted in successful bonding and therefore such gaseous agent mixture ratios also fall under the scope of this invention. For example, pre-mixing hydrogen and nitrogen gaseous agents in the ratios of between 0.0001 and 10.0 and the utilization thereof in the above described embodiment have proven successful in improving bond quality.

Selection of the room-ambient plasma source is driven by the requirements of the substrates and contact metals to be treated. For substrates that are sensitive to high energy electrons or ionized atoms with kinetic energy (for example, silicon CMOS circuitry or infrared detector materials), a confined glow-discharge plasma head such as the "Atomflo" series from SurFX, LLC is desirable. However, in less-sensitive situations, arc discharge-type ambient plasma heads, plasma torches or corona discharge heads could be used. Any type of room-ambient plasma head such as "Labeltech" by Tantek A/S, or Dyne-e-Mite 3-D treater by Enercon industries is considered to come within the scope of this invention.

With the method described herein, test die pairs with arrays of indium bumps were subjected to the above described process method in which the activated reagent gasses were simultaneously applied to the arrays of indium bumps. The test die were then bonded together (indium-to-indium as illustrated in FIG. 4) as described above and subsequently the die were pulled apart to determine the quality of the bond between the indium bumps. Optical microscope and SEM images were evaluated to confirm that the indium bumps from facing die had bonded together exceptionally well—to the point that separation of the bonded bumps resulted in a classic pointed tensile rupture—and showed no signs of the pre-bond interface between the indium bumps of the two die. Additionally, ellipsometer readings (an extremely sensitive measure of surface oxidation) were first taken on indium coupons immediately after being subjected to the activated reducing and passivating gaseous agents as disclosed in the method, and then ellipsometer readings were taken again over the next 50 hours. The subsequent ellipsometer readings over 50 hours remained virtually unchanged from the initial ellipsometer reading, indicating that the nitridized surfaces were stable and resisted subsequent oxidation. On the same day but utilizing different samples, the above steps were repeated using the sequential process (de-oxidation scan followed a few seconds later by nitridation/passivation scan) instead of simultaneously conducting the de-oxidation and the nitridation/passivation scans. Although ellipsometer readings showed some oxidation of the indium surfaces, the pull-test showed nearly equivalent tensile rupture—indicating that the sequential process is slightly inferior to the simultaneous process but is also a viable method for contact preparation.

Additionally, on the same day, the disclosed method was performed on a pair of dissimilar die: one die had an array of indium bumps and the other die had a flat titanium metallic contact pad (shown as the pad 9 in FIG. 3). Perfect tensile rupture was observed upon pulling the dissimilar die apart, and substantial indium was left adhered to the titanium metallic contact pads. This indicates that the inventive process is equally applicable to bump-on-pad contact configurations. This method was again repeated using nickel contact pads instead of titanium metallic pads and resulted in similar observations. When the above described sample pairs were bonded without the inventive method of surface preparation, virtually zero adhesion was observed between the samples.

It is readily anticipated that pad-on-pad configurations of the above-listed metals and alloys will exhibit comparable bonding success when treated with the disclosed method; and therefore fall under the purview of this invention.

And finally, the disclosed method was performed on a pair of dissimilar die: one die had an array of indium bumps and the other die had a plain non-metallic (silicon dioxide) surface (as shown at interface 10 in FIG. 3). Perfect tensile rupture was observed upon pulling the two dissimilar die apart, and a substantial amount of indium was left adhered to the silicon dioxide surface. This indicates that the process is equally applicable to bump-on-non-metallic contact configurations. In further tests, equivalent results were obtained when bonding indium to a plain silicon surface and to a silicon nitride surface. While demonstrated on silicon dioxide, silicon, and silicon nitride surfaces, it is anticipated that similar robust bonds could be created with other non-metallic surfaces including but not limited to: gallium arsenide, indium phosphide, indium-gallium arsenide, germanium, mercury-cadmium-telluride, indium antimonide, and oxides or nitrides thereof. Therefore these too fall under the purview of this invention. Likewise, samples of indium-silver alloy were treated with the taught method and bonded extremely well to treated titanium, nickel, indium, silicon, silicon nitride, and silicon dioxide surfaces. Therefore, alloy compositions as described above also fall under the purview of this invention.

In another preferred embodiment the metallic contacts are subjected to the inventive ambient-atmosphere plasma treatment in the manner described above to reduce and/or remove the oxidation on the surface of the metallic contacts and create a chemically altered surface on the metallic contacts, which inhibits subsequent oxidation. Following such treatment, the altered surfaces of the contacts are soldered to one or more metallic elements in the manner described below.

In the state of the art, it is known to couple two metallic elements together by melting and directing a flow of a filler metal to the joint between the elements. This filler metal is know as solder and is commonly formed from combinations of tin-lead, tin-zinc, lead-silver, cadmium-silver, zinc-aluminum, tin-silver, tin-bismuth, etc. depending on the function of the joint. In known methods of soldering, generally flux is applied to the surfaces of the metallic elements to be joined, after which heat and solder are applied, causing the solder to melt and be drawn into the joint by capillary action and bond to the materials to be joined. In the known soldering processes the flux is used to facilitate the flow of solder between the two metallic elements as well as prevent oxidation of the metallic elements and/or the solder. Oxidation on the metallic elements to be coupled may severely reduce the effectiveness of the connection.

In distinction from the known methods of soldering, by creating a passivation layer on the metallic contacts with the inventive method of preparing the surfaces of metallic contacts, oxidation and the effects caused thereby are minimized. As a result, it is now not necessary to utilize flux when connecting or bonding two metallic elements by soldering.

Figure 6:
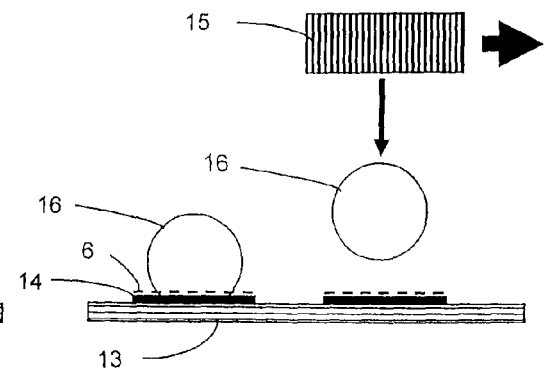
FIG. 6 shows a cross sectional view of a solder jet head applying solder balls to the metallic contacts of the first array.
Figure 7:
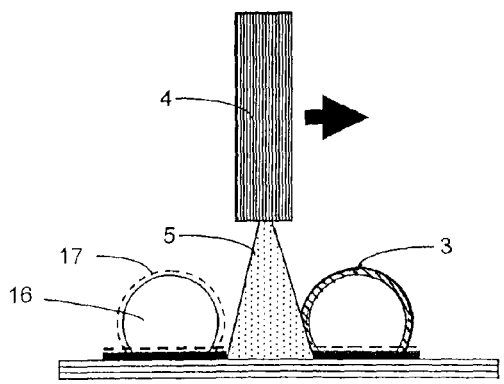
FIG. 7 shows a cross sectional view of an atmospheric-ambient plasma head subjecting the solder balls to an activated gaseous agent.

FIGS. 5-9 illustrate another preferred embodiment utilizing the ambient-atmosphere plasma treatment in a soldering application to treat an array of contacts, such as on a ball-grid array. As seen in FIG. 5, the room-ambient plasma source 4 is scanned across the surface of a first substrate 13 and an array of oxidized metallic contacts 14, subjecting the metallic contacts 14 to activated gaseous agents 5 to chemically reduce and/or remove the oxidation 3 from, and create a chemically altered surface 6 on, the metallic contacts 14, such that the metallic contacts 14 are protected from subsequent oxidation. After the array of metallic contacts 14 has been treated, solder balls 16 are applied to the treated metallic contacts 14 by a solder jet head 15 such as the MJ-SF solderjet head by Micro-Fab Technologies, Inc (FIG. 6). The molten solder balls 16 adhere and wet instantly to the altered surface 6 on the metallic contacts 14 without the need for flux. Once the soldering balls 16 are attached to the array of metallic contacts 14, they can be subsequently treated, as seen in FIG. 7, by subjecting the solder balls 16 to the activated gaseous agents 5 to chemically reduce and/or remove the oxidation 3 from, and create a chemically altered surface 17 on, the solder balls 16, such that solder balls 16 are protected from subsequent oxidation.

Figure 8:
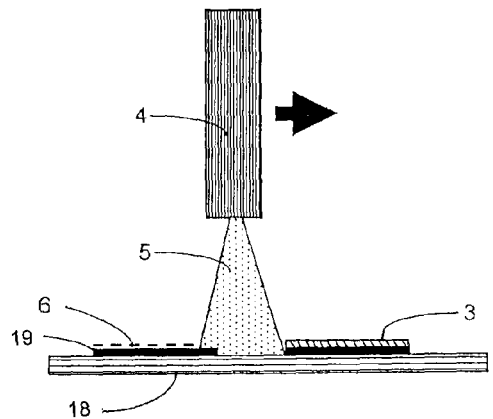
FIG. 8 shows a cross sectional view of an atmospheric-ambient plasma head subjecting metallic contacts of a second array to an activated gaseous agent.
Figure 9:
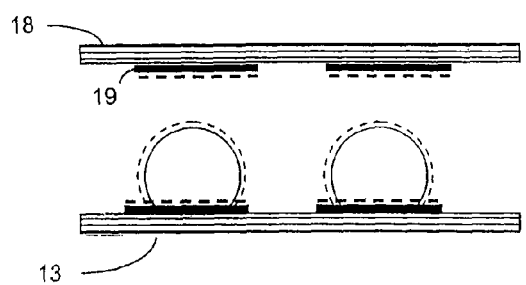
FIG. 9 shows a cross sectional view of the metallic contacts of the first array aligned with the solder balls and the metallic contacts of the first array.
Figure 10:
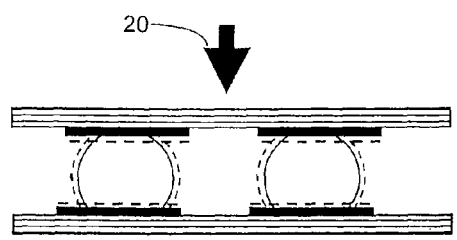
FIG. 10 shows a cross sectional view of a bond formed between the metallic contacts of the second array and the solder balls and the metallic contacts of the first array.

A second array of metallic contacts 19, as illustrated in FIG. 8, is treated in the same manner in which the array of metallic contacts 14 was treated. That is, a substrate 18 and the second array of metallic contacts 19, being supported thereby, are scanned one or more times by the room-ambient plasma source 4 to subject the metallic contacts 19 to the activated gaseous agents 5 which chemically reduces and/or removes the oxidation 3 on the metallic contacts 19 and creates a chemically altered surface 6, such that the metallic contacts 19 are protected from subsequent oxidation. Although the steps of reducing and/or removing the oxidation from and creating a chemically altered surface on the solder balls and the metallic contacts are described above as occurring simultaneously, it is possible to achieve the noted benefits by treating the surfaces in a sequential process where one scan (or series of scans) of the plasma source performs the de-oxidation/reduction process and a subsequent scan (or series of scans) performs the nitridation/passivation process before excessive oxidation can occur. Subsequently, as illustrated in FIGS. 9 and 10, the substrate 18 and the second array of metallic contacts 19 are properly aligned with the first substrate 13 and the solder balls 16 and a compression force 20 is then applied to one or both of the substrates 13 and 18 to join the array of metallic contacts 14 and the second array of metallic contacts 19 and form a bond therebetween utilizing the solder balls 16. In a beneficial manner, bonding of the prepared solder balls 16 to the prepared second array of metallic contacts 19 as described above completes the "flip-chip" solder bond without the use of flux. Additionally, the surface preparation of the mating surfaces is so receptive to bonding that the flip-chip bond can be performed at temperatures either below or above the melting point of the solder (for example between 20 degrees C. and 250 degrees C.). In either case, the surface passivation created by the taught method inhibits oxidation for an extended period to facilitate bonding.

It is to be understood that the present invention should not be limited to the above described embodiments, but may be practiced in various forms within the scope of the present invention.

I claim:

1. A method of preparing metallic contacts for interconnect bonding, the method comprising the steps of:
   applying a plasma-activated chemical reducing agent, via a room-ambient plasma applicator, to at least a first metallic contact, supported by a substrate, to remove oxidation and create a newly de-oxidized metal surface on the first metallic contact; and
   applying a plasma-activated chemical passivation agent, via the room-ambient plasma applicator, to the first metallic contact to convert the newly de-oxidized metal surface to create a metal nitride passivation layer on the first metallic contact to inhibit oxidation of the first metallic contact;
   wherein said applying steps are performed under room-ambient conditions;
   wherein said applying steps are performed by scanning said room-ambient plasma applicator across said first metallic contact on said substrate; and
   wherein the gap between said room-ambient plasma applicator and said first metallic contact during each said applying step is at most five millimeters.

2. The method according to claim 1, further comprising the subsequent step of bonding the first metallic contact to a metallic surface;
   wherein all said applying steps are performed by scanning said room-ambient plasma applicator across each said metallic contact on each said substrate.

3. A method of preparing metallic contacts for interconnect bonding, the method comprising the steps of:
   applying a plasma-activated chemical reducing agent, via a room-ambient plasma applicator, to at least a first metallic contact, supported by a substrate, to remove oxidation and create a newly de-oxidized metal surface on the first metallic contact; and
   applying the plasma-activated chemical reducing agent, via the room-ambient plasma applicator, to at least a second metallic contact, supported by a second substrate, to remove oxidation and create a newly de-oxidized metal surface on the second metallic contact; and applying a plasma-activated chemical passivation agent, via the room-ambient plasma applicator, to the first metallic contact to convert the newly de-oxidized metal surface to create a metal nitride passivation layer on the first metallic contact to inhibit oxidation of the first metallic contact;

applying the plasma-activated chemical passivation agent, via the room-ambient plasma applicator, to the second metallic contact to convert the newly de-oxidized metal surface to create a metal nitride passivation layer on the second metallic contact to inhibit oxidation of the second metallic contact; and bonding the first metallic contact to the second metallic contact to form an interconnect bond between the first and the second metallic contacts;

wherein all said applying steps are performed under room-ambient conditions;

wherein all said applying steps are performed by scanning said room-ambient plasma applicator across each said metallic contact on each said substrate and wherein the gap between said room-ambient plasma applicator and the respective metallic contact during each said applying step is at most five millimeters.

4. A method of preparing metallic contacts for interconnect bonding, the method comprising the steps of:

simultaneously, in a single step, applying a plasma-activated chemical reducing agent, via a room-ambient plasma applicator, to at least a first metallic contact, supported by a substrate, to remove oxidation and create a newly de-oxidized metal surface on the first metallic contact; and applying a plasma-activated chemical passivation agent, via the room-ambient plasma applicator, to the first metallic contact to convert the newly de-oxidized metal surface to create a metal nitride passivation layer on the first metallic contact to inhibit oxidation of the first metallic contact;

wherein said applying step is performed under room-ambient conditions; wherein said applying step is performed by scanning said room-ambient plasma applicator across said first metallic contact; and wherein the gap between said room-ambient plasma applicator and said first metallic contact, during said applying step, is at most five millimeters.

5. The method according to claim 4, wherein the chemical reducing agent is selected from a group consisting of a hydrogen gas, a hydrogen forming gas, a hydrogen/argon mixture, a hydrogen/nitrogen mixture, ammonia, hydrogen sulfide, methane, carbon monoxide and a hydrocarbon; and the chemical passivation agent is selected from a group consisting of nitrogen, a nitrogen forming gas, a hydrogen/nitrogen mixture, ammonia, and a nitrogen containing gas.

6. The method according to claim 1, further comprising the step of emitting at least one of a readily ionizable inert gas to the first metallic contact from the room-ambient plasma applicator while simultaneously applying both the plasma-activated chemical reducing agent and the plasma-activated chemical passivation agent to the first metallic contact via the room-ambient plasma applicator in a single step.

7. The method according to claim 3, further comprising the step of at least substantially disintegrating the metal nitride passivation layer applied to the first and the second metallic contacts by compression bonding the first metallic contact to the second metallic contact; wherein all said applying steps are performed by scanning said room-ambient plasma applicator across each said metallic contact on each said substrate.

8. The method according to claim 7, further comprising the step bonding the first metallic contact to the second metallic contact by one of a flip-chip bonding process, a cold weld bonding process and a soldering bonding process.

9. The method according to claim 6, further comprising the steps of using hydrogen gas as the chemical reducing agent and supplying the hydrogen gas at a flow rate of between 0.005 and 0.5 LPM to the room-ambient plasma applicator;

using nitrogen gas as the plasma-activated chemical passivation agent and supplying the nitrogen gas at a flow rate of between 0.01 and 5 LPM to the room-ambient plasma applicator;

using helium gas as the inert gas and supplying the inert gas at a flow rate of between 1.0 and 30 LPM to the room-ambient plasma applicator;

controlling the temperature of the contacts to between 20° C. and 300° C. during at least one of the reducing and passivation steps; and applying a plasma power, of between 20 and 200 watts, to the room-ambient plasma applicator to generate the plasma-activated chemical reducing species and the plasma-activated chemical passivation species.

10. The method according to claim 6, further comprising the steps of using hydrogen gas as the chemical reducing agent and supplying the hydrogen gas at a flow rate of 0.05 LPM to the room-ambient plasma applicator;

using nitrogen gas as the plasma-activated chemical passivation agent and supplying the nitrogen gas at a flow rate of 0.1 LPM to the room-ambient plasma applicator;

using helium gas as the inert gas and supplying the inert gas at a flow rate of 10 LPM to the room-ambient plasma applicator; and applying a plasma power, of 70 watts, to the room-ambient plasma applicator to generate the plasma-activated chemical reducing agent and the plasma-activated chemical passivation agent.

11. The method according to claim 1, further comprising the step of forming the first metallic contact from at least one of Indium, Gallium, Aluminum, Tin, Lead, Copper, Silver, Bismuth, Molybdenum, Tantalum, Nickel, Tungsten, Titanium, Gold and combinations thereof.

12. The method according to claim 1, further comprising the steps of:

applying a solder ball to the metal nitride passivation layer on the first metallic contact;

applying the plasma-activated chemical reducing agent, via the room-ambient plasma applicator, to the solder ball to remove oxidation from the solder ball; and applying the plasma-activated chemical passivation agent, via the room-ambient plasma application, to the solder ball to create the metal nitride passivation layer on the solder ball;

wherein the gap between said room-ambient plasma applicator and the solder ball, during each step of applying via the room-ambient plasma applicator, is at most five millimeters.

13. The method according to claim 12, further comprising the steps of applying the plasma-activated chemical reducing agent, via the room-ambient plasma applicator, to a second metallic contact to remove oxidation from the second metallic contact;

applying the plasma-activated chemical passivation agent to the second metallic contact to create the metal nitride passivation layer on the second metallic contact; and soldering the first metallic contact to the second metallic contact via the solder ball;

wherein the gap between said room-ambient plasma applicator and the respective metallic contact during each said applying step is at most five millimeters.

14. The method according to claim 6, further comprising the step of purging atmospheric oxygen from a reaction zone located adjacent the first metallic contact at least while applying one of the plasma-activated chemical reducing agent and the plasma-activated chemical passivation agent via the room-ambient plasma applicator.

15. A method of preparing metallic contacts for interconnect bonding, the method comprising the steps of:
simultaneously directing a mixture of a plasma-activated chemical reducing agent, a plasma-activated chemical passivation agent and an inert gas from a room-ambient plasma applicator to metallic contacts on a first substrate and to metallic contacts on a second substrate to substantially remove oxidation therefrom, and create newly deoxidized metal surfaces on said metallic contacts of the first and second substrates and convert said newly de-oxidized metal surfaces to create metal nitride passivation layers on said metallic contacts of the first and the second substrates; and
bonding the metallic contacts of the first and the second substrates to one another to form an interconnect bond;
wherein said directing step is performed under room-ambient conditions; and wherein the gap between said room-ambient plasma applicator and the respective metallic contacts during said simultaneously directing step is at most five millimeters.

16. The method according to claim 14, further comprising the steps of using hydrogen gas as the plasma-activated chemical reducing agent and supplying the hydrogen gas at a flow rate of between 0.005 and 0.5 LPM to the room-ambient plasma applicator;
using nitrogen gas as the plasma-activated chemical passivation agent and supplying the nitrogen gas at a flow rate of between 0.01 and 5 LPM to the room-ambient plasma applicator;
using helium gas as the inert gas and supplying the helium gas at a flow rate of between 1.0 and 30 LPM to the room-ambient plasma applicator,
controlling the temperature of the contacts to between 20° C. and 300° C. during at least one of the reducing and passivation steps, and
applying a plasma power, of between 20 and 200 watts, to the room-ambient plasma applicator to generate the plasma-activated chemical reducing agent and the plasma-activated chemical passivation agent.

17. A method of bonding metallic contacts, comprising:
applying a plasma-activated chemical reducing agent to at least a first metallic contact and a second metallic contact;
applying a plasma-activated chemical passivation agent to each said metallic contact; and
compression bonding said first metallic contact to said second metallic contact;
wherein said plasma-activated chemical reducing agent removes oxidation and creates a newly de-oxidized metal surface on each said metallic contact; and wherein said plasma-activated chemical passivation agent converts the newly de-oxidized metal surface to create a metal nitride passivation layer on each said metallic contact to inhibit oxidation;
wherein each said applying step is performed by a room-ambient plasma applicator operating under room-ambient conditions;
wherein all said applying steps are performed by scanning said room-ambient plasma applicator across each said metallic contact; and wherein the gap between said room-ambient plasma applicator and the respective metallic contact during each said applying step is at most five millimeters.

* * * * *